United States Patent [19]

Yue et al.

[11] Patent Number: 5,496,759
[45] Date of Patent: Mar. 5, 1996

[54] HIGHLY PRODUCIBLE MAGNETORESISTIVE RAM PROCESS

[75] Inventors: Jerry Yue, Roseville; Allan T. Hurst, Anoka; Tangshiun Yeh, St. Paul; Huang-Joung Chen, Eagan, all of Minn.

[73] Assignee: Honeywell Inc., Minneapolis, Minn.

[21] Appl. No.: 365,852

[22] Filed: Dec. 29, 1994

[51] Int. Cl.⁶ .............................................. H01L 21/8239
[52] U.S. Cl. .................................. 437/52; 437/48
[58] Field of Search .............................. 437/52, 48, 228; 365/173, 158

[56] References Cited

U.S. PATENT DOCUMENTS 4,897,288  1/1990  Jenson ...................................... 365/173
4,918,655  4/1990  Daughton ................................. 365/173
4,945,397  7/1990  Schuetz .................................... 365/173

Primary Examiner—Tom Thomas
Attorney, Agent, or Firm—Gregory A. Bruns

[57] ABSTRACT

A process for forming a magnetoresistive bit and an interconnection to an underlying component forms a pattern in an amorphous dielectric overlying the magnetic materials. Portions of the magnetic materials are removed to form a bit having a smooth bit edge profile by ion milling. The bit has a bit end located over the underlying component. A second amorphous dielectric layer is deposited and etched at the bit end to form a via at the underlying component. Conventional first metal is used to form the interconnection.

15 Claims, 5 Drawing Sheets

5,496,759

HIGHLY PRODUCIBLE MAGNETORESISTIVE RAM PROCESS

BACKGROUND OF THE INVENTION

The present invention relates to ferromagnetic thin film memories and more particularly to a process for the fabrication of a thin film magnetoresistive memory device.

The process for manufacturing the magnetoresistive bit lines involves depositing one or more layers of material over an underlying layer or surface, and etching the deposited material to a desired configuration of magnetic bits. Certain problems arise from the manufacturing process. A first problem is magnetic in nature and relates to the magnetic bit definition and specifically to the bit edge profile. In the past, a tungsten material has been used over the magnetic materials stack. The tungsten serves as a shorting connection between individual magnetic bits and the formation of a magnetic bit involves etching away some of the tungsten overlying a bit. Due to the etching process and the nature of the tungsten material, the bit edge profile exhibits a roughness and there may be some undercutting of the magnetic materials stack beneath the tungsten. The roughness and the undercutting may contribute to undesirable magnetic effects. The desired bit edge profile is a smooth edge with no undercutting.

A second problem relates to the control of contact resistance. In the past, the formation of a contact or connection to an underlying integrated circuit component in the semiconductor wafer included the opening of a contact and the depositing of the magnetic material stack within the contact. The presence of the magnetic materials within the contact can adversely affect the control of contact resistance.

Thus a need exists for a highly producible magnetoresistive random access memory process that provides a solution to the magnetic bit edge profile problems and the contact resistance problems of the past.

SUMMARY OF THE INVENTION

The present invention solves these and other needs by providing a process for forming a magnetoresistive memory device on an insulative substrate having an underlying integrated circuit component and interconnecting the device and the component, and includes the following steps: forming an insulating layer on the substrate and forming a magnetic materials layer on the insulating layer; forming a first amorphous dielectric layer on the magnetic materials layer; selectively removing portions of the first layer of amorphous dielectric to define a pattern for a magnetic bit; selectively removing portions of the magnetic materials layer and the first insulating layer according to the pattern to define a magnetic bit; forming a second layer of amorphous dielectric over the first layer; removing portions of the second layer of amorphous dielectric to expose a bit end with a remaining portion of the second layer of amorphous dielectric protecting a bit edge profile; forming a via in said insulating substrate at the bit end to expose a portion of the underlying component; forming a conductive layer over the second layer of amorphous dielectric and into the via; and etching the conductive layer to form the interconnection.

DESCRIPTION OF THE DRAWINGS

FIGS. 1 to 7 are longitudinal cross-sectional views showing the steps of forming a magnetoresistive bit and interconnecting the bit end to an underlying integrated circuit component at one and to a.

DETAILED DESCRIPTION

Figure 1:
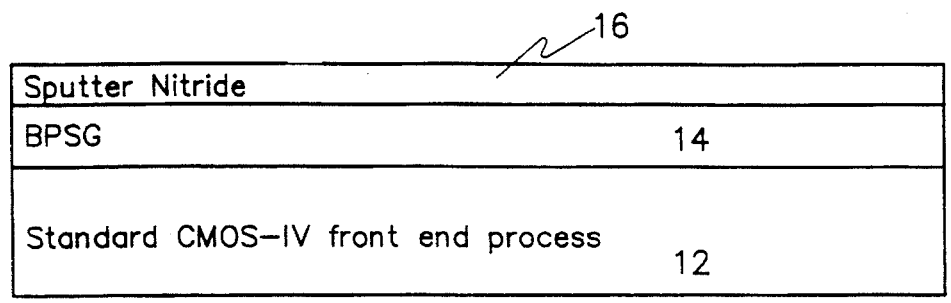

The process of the present invention begins with wafers processed up through contact oxide deposition. U.S. Pat. No. 4,73 1,757 dated Mar. 15, 1988 and U.S. Pat. No. 4,780,848 dated Oct. 25, 1988 and assigned to Honeywell Inc., include background material on magnetoresistive memories and are hereby incorporated by reference. A CMOS wafer 12 is shown in FIG. 1. Depending on the thickness of the standard oxide, additional oxide may be added. Normal front-end IC processing typically deposits approximately 5000 angstroms of borophosphosilicate glass (BPSG) over the poly runners and field areas. The topography in a normal IC process can be more severe than is desired for MRAM devices. To provide the additional oxide thickness needed to smooth out the remaining underlayer topography, the MRAM process typically adds an additional approximately 3000 angstroms of BPSG, and reflows it at approximately 800 degrees C. to result in the approximately 8000 angstrom layer 14. The thickness of layer 14 may could be varied from 5000 to 10000 angstroms. Following reflow, a diffusion barrier layer 16 e.g., of silicon nitride, is sputter deposited to a thickness of approximately 300 angstroms to act as a diffusion barrier between the underlying oxide 14 and a future magnetic materials deposition.

Next in the process is the deposition of the magnetic layers or magnetic stack 18. Magnetic stack 18 is a sandwich-type structure containing a first layer 20 of a 65% Ni, 15% Fe, 20% Co Permalloy alloy of approximately 150 angstroms. Next, a non-magnetic intermediate layer 22 of TaN is deposited to a thickness of approximately 50 angstroms. Then a second layer 24 of the Permalloy alloy is deposited to a thickness of approximately 150 angstroms. This is followed by depositing a second non-magnetic resistive layer 26 of tantalum nitride to a thickness of 50–100 angstroms, preferably about 550 angstroms. A capping, or etch stop, layer 28 of Chromium silicon (CrSi) is then deposited to a thickness in the range of 100 to 1500 angstroms, preferably about 800 angstroms. All of the depositions of magnetic stack 18 are to be done in-situ, for example in a Comptech ISL-3000 sputter deposition system. The deposition of Permalloy layers 20 and 24 are to be done in the presence of a 25 Oersted magnetic field. The wafer is then subjected to a 350 degree C., 1 hour, 30 Oersted anneal to set the easy axis of Permalloy layers 20 and 24.

Figure 2:
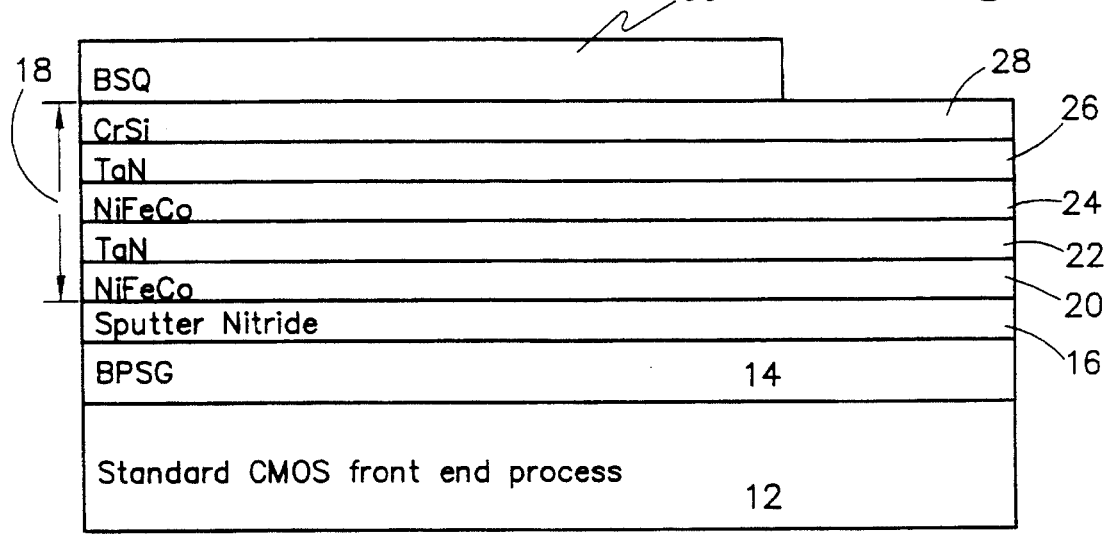
Figure 3:
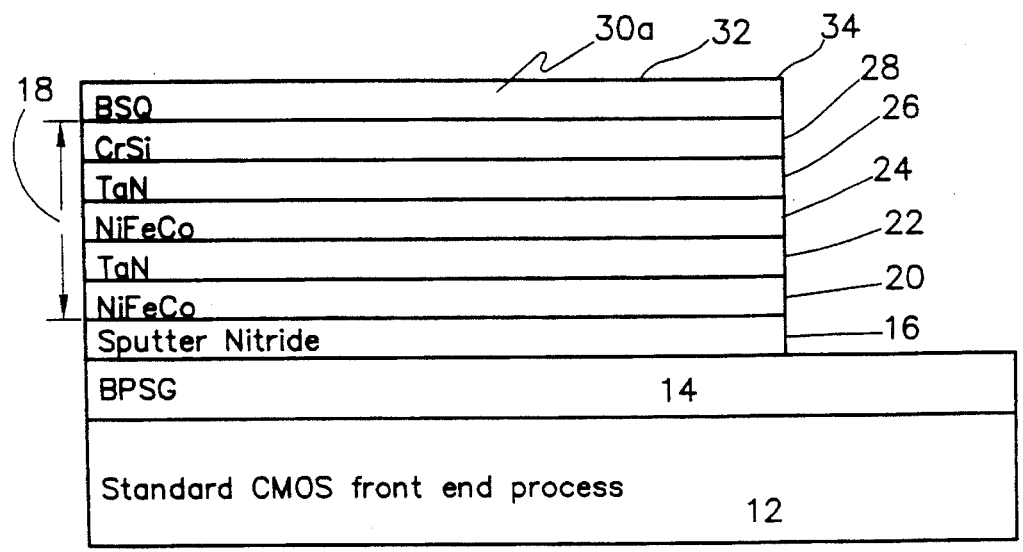
Figure 9:
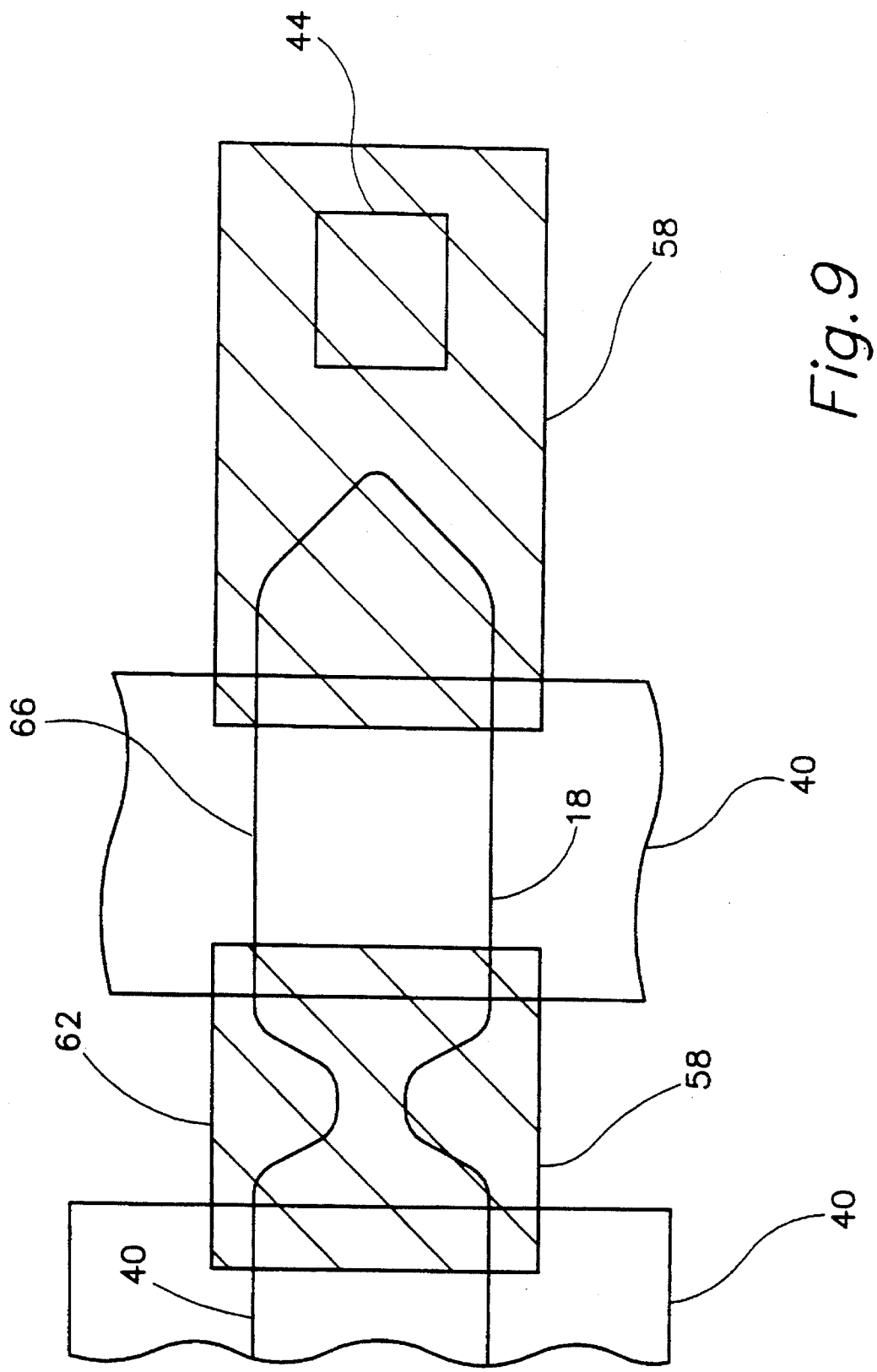
FIG. 9 is a top plan view of a magntoresistive bit and interconnection as shown in cross section in FIG. 7.

Still referring to FIG. 2, a first layer 30 of an amorphous dielectric, e.g., bias sputtered quartz (BSQ), is deposited to a thickness of approximately 3200 angstroms. BSQ layer 30 is then patterned and etched to serve as a masking layer as shown in FIG. 3. This masking layer defines the MRAM bit pattern for ion milling. The wafers are then ion milled, for example in a Commonwealth ion mill. The ion milling removes the exposed portions of magnetic stack 18 to form a bit pattern. A top view of the bit pattern is seen in FIG. 9. The longitudinal section through a bit 32 having a bit end 34 is shown in FIG. 3. The ion milling at bit end 34 extends slightly into BPSG layer 14 as shown. In addition, the ion milling removes approximately 2600 angstroms of BSQ layer 30 which covers bit 32, resulting in BSQ layer 30a having a thickness of approximately 600 angstroms.

Figure 4:
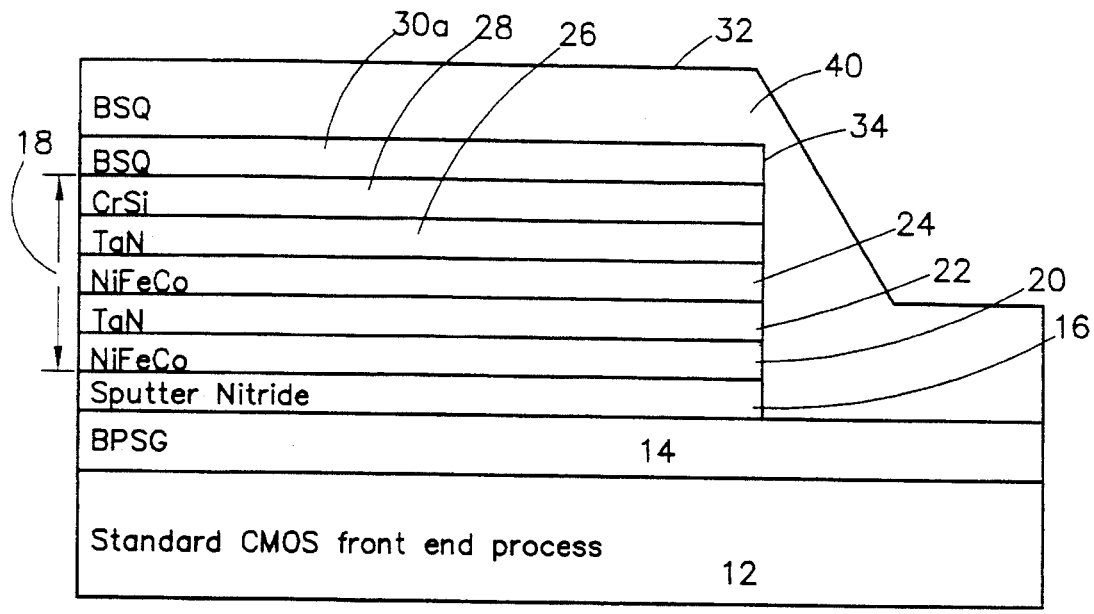
Figure 5:
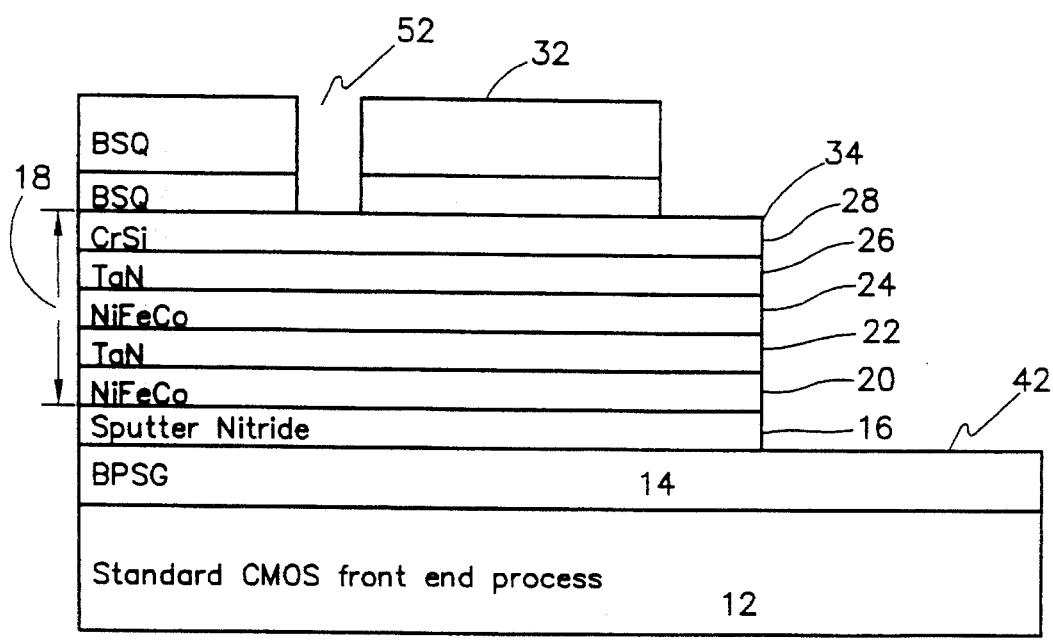
Figure 6:
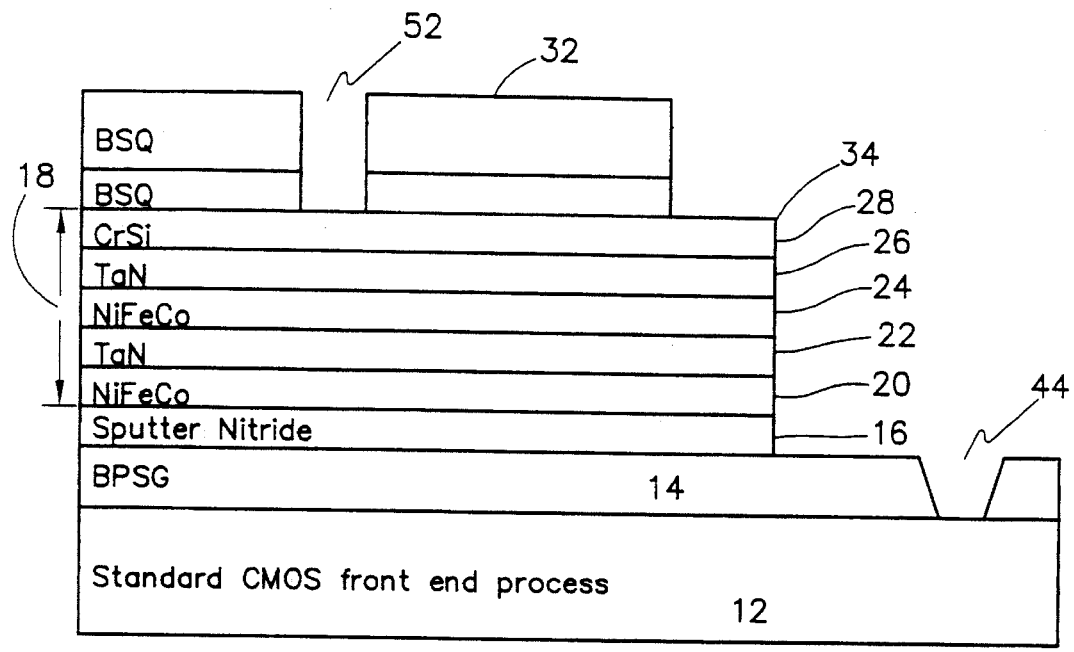

Referring to FIG. 4, next a second layer 40 of amorphous dielectric, e.g., bias sputtered quartz (BSQ), is deposited to a thickness of approximately 2500 angstroms. BSQ layer 40 is deposited to protect the sidewalls of bit 32 from bit oxide and first metal etch which is used for opening the bit-end contact between magnetic stack 18, bit-end and first metal. A bit oxide photo cut is then made at silicon interconnection location 42 and shorting bar location 52. As shown in FIG. 6, a dry etch is used to remove BSQ layer 40 and BSQ layer 30a for a silicon interconnection at bit end 34 and at shorting bar location 52. At bit end 34 a portion of BSQ layer 40 and BSQ layer 30a are removed to facilitate better first metal step coverage.

Next a contact photo cut is made at silicon interconnection location 42 and a dry etch is used to remove portions of BPSG layer 14 as shown in FIG. 6 to form via 44.

Figure 7:
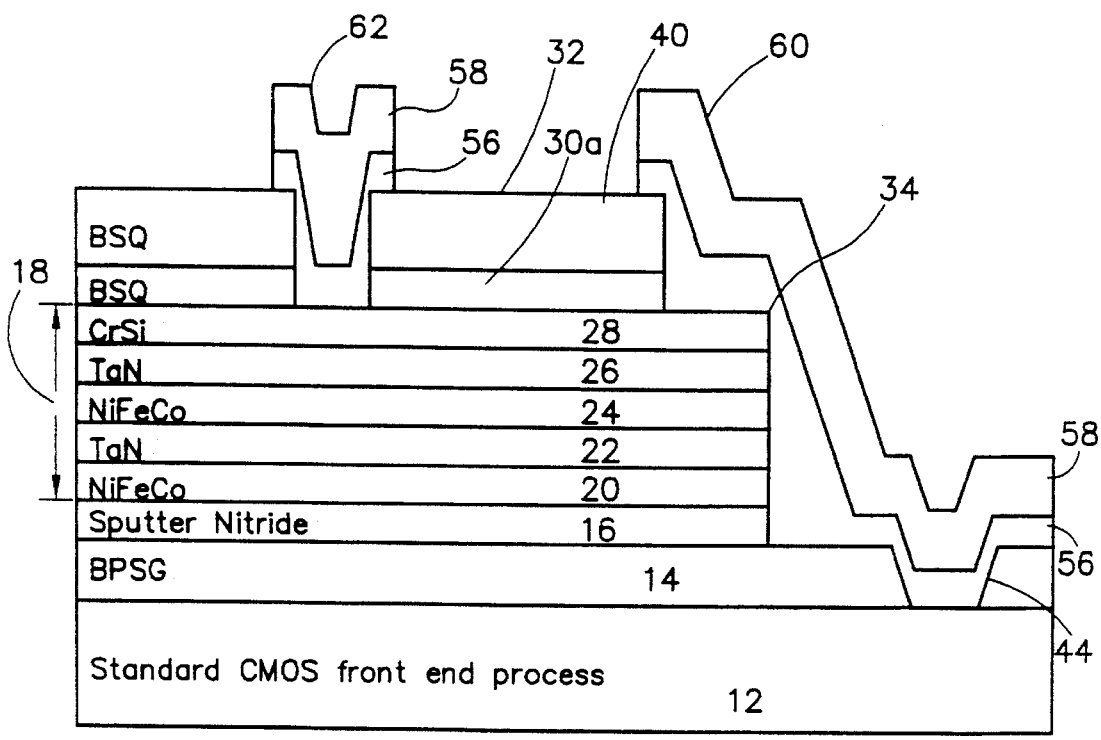

The process proceeds with the deposition of layer 56 of titanium tungsten (TiW) to a thickness of approximately 1200 angstroms. Layer 56 covers BSQ layer and extends into via 44 and contacts the underlying silicon component. This is followed by deposition of layer 58 of aluminum copper AlCu to a thickness of about 5000 angstroms. The deposition of first metal 57 comprised of layer 56 and layer 58 is by known methods. The longitudinal cross-sectional drawing of FIG. 7 shows bit end contact 60 and shorting bar 62 after photo cut and etching of first metal.

After first metal etch, a 200 to 1000 angstrom, preferably a 500 angstrom thick layer of sputtered nitride is deposited to serve as an adhesion layer of first metal and inter-metal dielectric. Following the sputtered nitride, an 8000 angstrom thick layer of bias sputtered quartz (BSQ) is deposited as the inter-metal dielectric. Vias are cut and etched, and second metal comprised of 1200 angstroms TiW, 1.0 μg AlCu and 300 angstroms top TiW is deposited, patterned and etched.

A 9000 angstrom thick layer of plasma nitride is used as a final passivation layer. Following passivation, the wafers are annealed at 250 to 500 degrees C., preferably 325° C. for one hour in a magnetic field to permanently set the easy axis orientation transverse to the bits. A 4000 Oersted magnetic field has been used successfully. Other magnetic field values may also be used.

In the process described herein, the amorphous dielectric layers 30 and 40 were described as bias sputter quartz. Other amorphous dielectric materials may be used for example sputter silicon nitride.

Figure 8:
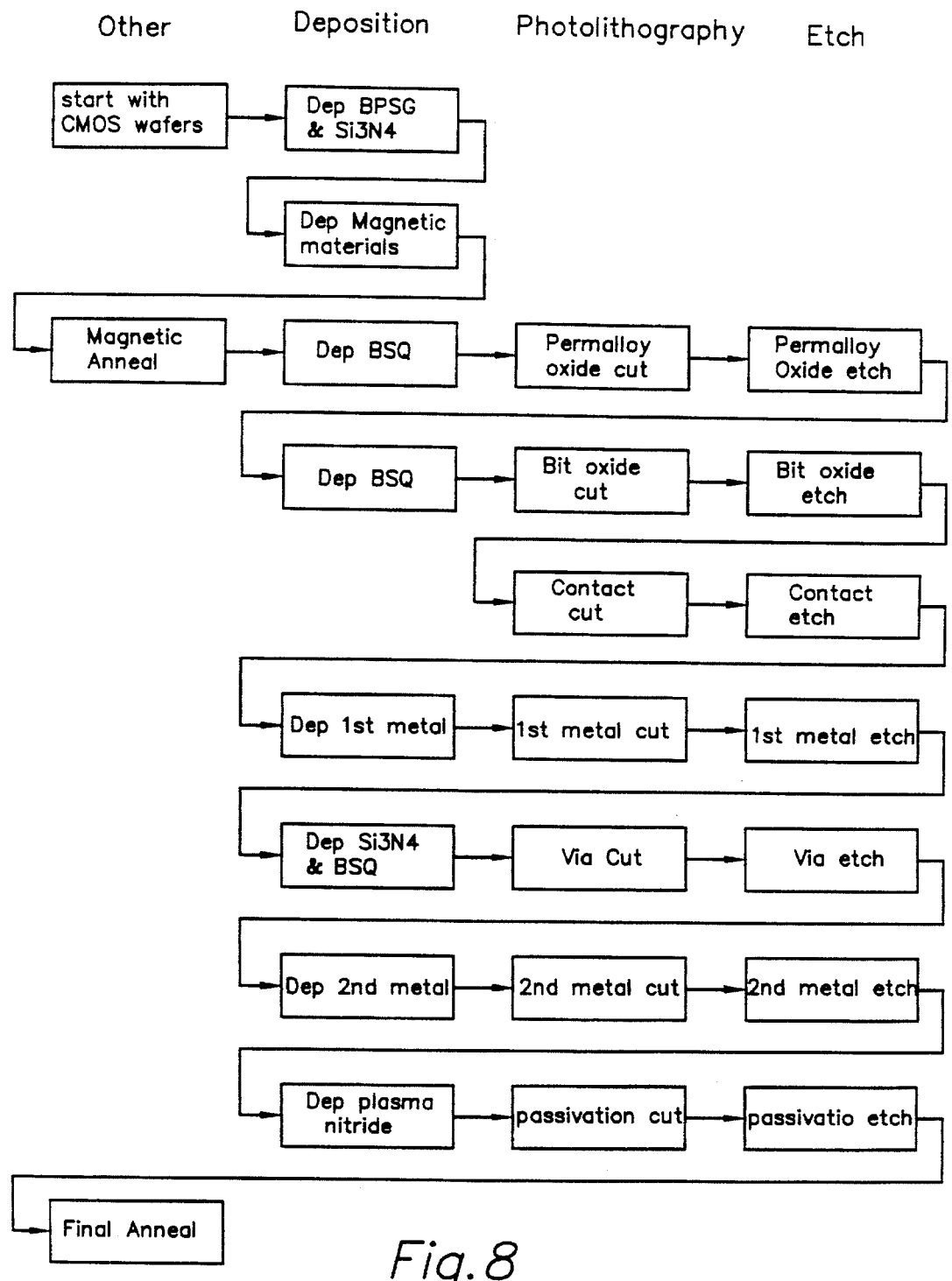
FIG. 8 is a process flow diagram of the entire process.

The entire process flow is shown schematically in FIG. 8.

FIG. 9 shows a top plan view of a magnetic bit as formed by the process steps shown in FIGS. 1–7. In FIG. 9, bias sputter quartz layers 30 and 40 overlie magnetic materials 18 at active bit portion 66. First metal 58 contacts bit end 34 and extends into via 44 to contact the underlying silicon thus forming bit end contact 60. First metal 58 also forms shorting bar 62. The top view shape of magnetic materials layer 18 is also shown in FIG. 9.

An advantage of the process of the present invention is that the bias sputter quartz layer 30 which forms a pattern for the magnetic bit allows the magnetic bit to be very well defined by ion milling. This results in a very smooth bit edge profile beneath the bias sputter quartz which improves the magnetic qualities of the bit.

An additional advantage is in the formation of the connection of the bit end to the underlying component. In the present invention the process of forming the contact is independent of the process of defining the magnetic bit. That is, after the bit has been defined and is protected by bias sputter quartz or another amorphous dielectric material, the contact etch is performed. These advantages allow the bit definition process and the connection process to be seperately optimized.

The scope of the invention is to be indicated by the appended claims, rather than by the foregoing description.

We claim:

1. A process for forming a magnetoresistive memory on a semiconductor substrate having an underlying integrated circuit component and an insulating layer formed thereover, and forming an interconnecting between said device and said underlying component, comprising the steps of:

forming a first insulating layer on said substrate;

forming a materials stack on said first insulating layer;

forming a first amorphous dielectric layer on said materials stack;

selectively removing portions of said first amorphous dielectric layer to define a pattern for a magnetic bit;

removing portions of said materials stack and said first insulating layer according to said pattern to define a magnetic bit having a bit edge profile and having a bit end located over said underlying component;

forming a second amorphous dielectric layer over said first amorphous dielectric layer;

removing portions of said second amorphous dielectric layer to expose said bit end with a remaining portion of said second amorphous dielectric layer protecting said bit edge profile;

selectively forming a via in said insulating substrate at said bit end to expose a portion of said underlying component;

forming a first conductive layer over said second amorphous dielectric layer, said first conductive layer contacting said bit end and extending into said via and contacting said component; and etching said first conductive layer to form said interconnection.

2. A process as recited in claim 1 wherein said first amorphous dielectric layer and said second amorphous dielectric layer comprise bias sputter quartz.

3. A process as recited in claim 1 wherein said first amorphous dielectric layer and said second amorphous dielectric layer comprise sputter silicon nitride.

4. A process as recited in claim 2 wherein said process of removing portions of said magnetic materials layer and said first insulating layer according to said pattern to define a magnetic bit having a bit edge profile and having a bit end located over said underlying component comprises ion milling.

5. A process as recited in claim 2 wherein said step of removing portions of said second bias sputter quartz layer to expose said bit end comprises removing a portion of said first bias sputter quartz layer at said bit end to provide an improved first metal step coverage.

6. A process as recited in claim 5 wherein said step of removing portions of said first and second bias sputter quartz layers to expose said bit end further comprises selectively removing portions of said first and second bias sputter quartz layers at a location for a shorting bar, said location spaced from said bit end.

7. A process as recited in claim 6 wherein said step of forming a materials stack is done by successive sputter deposition steps.

8. A process for forming a magnetoresistive memory device on a semiconductor substrate having an insulating layer formed thereover and an underlying integrated circuit component, and forming an interconnection between said device and said underlying component, comprising the steps of:

forming a stack of a plurality of materials on said insulating layer, said stack including a first layer of a magnetic material and a second layer of a magnetic material, said first and second layers separated by a third layer of material;

forming a first layer of an amorphous dielectric on said stack;

selectively removing portions of said first layer of said amorphous dielectric to define a pattern for a magnetic bit;

removing portions of said stack according to said pattern to define a magnetic bit having a bit edge profile and having a bit end located over said underlying component;

forming a second layer of an amorphous dielectric over said first layer of amorphous dielectric;

removing portions of said second layer of amorphous dielectric to expose said bit end with a remaining portion of said second layer of amorphous dielectric protecting said bit edge profile;

selectively forming a via in said insulating layer at said bit end to expose a portion of said underlying component;

forming a first conductive layer over said second layer of amorphous dielectric, said first conductive layer extending into said via and contacting said component; and etching said first conductive layer to form said interconnection.

9. A process as recited in claim 8 wherein said step of forming a stack of a plurality of materials on said insulating layer includes forming a diffusion barrier on said insulating layer before forming said stack.

10. A process as recited in claim 8 wherein said first layer of an amorphous dielectric and said second layer of an amorphous dielectric comprise bias sputter quartz.

11. A process as recited in claim 9 wherein said stack comprises a first layer of a NiFeCo alloy, a layer of tantalum nitride and a second layer of a NiFeCo alloy.

12. A process for forming a magnetoresistive memory device on a semiconductor substrate having an insulating layer formed thereover and an underlying integrated circuit component, and forming an interconnection between said device and said underlying component, comprising the steps of:

forming a diffusion barrier on said insulating layer;

forming a stack of a plurality of materials on said insulating layer, said stack including a first layer of a magnetic material, and a second layer of a magnetic material, said first and second layers separated by a third layer of material;

forming a first layer of bias sputter quartz on said stack;

selectively removing portions of said first layer of bias sputter quartz to define a pattern for a magnetic bit;

removing portions of said stack according to said pattern to define a magnetic bit having a bit edge profile and having a bit end located over said underlying component;

forming a second layer of bias sputter quartz over said first layer of bias sputter quartz;

performing ion milling to remove portions of said second layer of bias sputter quartz to expose said bit end with a remaining portion of said second layer of bias sputter quartz protecting said bit edge profile;

selectively forming a via in said insulating layer at said bit end to expose a portion of said underlying component;

forming a first metal layer over said second layer of bias sputter quartz, said first metal layer contacting said bit end and extending into said via and contacting said component; and etching said first metal layer to form a connection at said bit end.

13. A process as recited in claim 12 wherein said conductive layer comprises a first layer of TiW and a second layer of AlCu.

14. A process as recited in claim 12 wherein said step of removing portions of said second bias sputter quartz layer to expose said bit end comprises removing a portion of said first bias sputter quartz layer at said bit end.

15. A process as recited in claim 12 wherein said step of removing portions of said first and second bias sputter quartz layers to expose said bit end further comprises selectively removing portions of said first and second bias sputter quartz layers at a location for a shorting bar, said location spaced from said bit end.

\* \* \* \* \*